(12) United States Patent
Drechsel et al.

(10) Patent No.: US 7,675,057 B2
(45) Date of Patent: Mar. 9, 2010

(54) PHOTOACTIVE COMPONENT WITH ORGANIC LAYERS

(75) Inventors: Jens Drechsel, Dresden (DE); Martin Pfeiffer, Dresden (DE); Bert Maennig, Dresden (DE); Karl Leo, Dresden (DE)

(73) Assignee: Technische Universitaet Dresden, Dresden (DE)

( * ) Notice: Subject to any disclaimer, the term of this patent is extended or adjusted under 35 U.S.C. 154(b) by 728 days.

(21) Appl. No.: 10/549,775

(22) PCT Filed: Mar. 19, 2004

(86) PCT No.: PCT/DE2004/000574

§ 371 (c)(1),
(2), (4) Date: Aug. 4, 2006

(87) PCT Pub. No.: WO2004/083958

PCT Pub. Date: Sep. 30, 2004

(65) Prior Publication Data

US 2007/0090371 A1 Apr. 26, 2007

(30) Foreign Application Priority Data

Mar. 19, 2003 (DE) ................................. 103 13 232

(51) Int. Cl.
*H01L 35/24* (2006.01)
*H01L 51/00* (2006.01)
*H01L 31/072* (2006.01)
*H01L 31/109* (2006.01)
*H01L 31/0328* (2006.01)
*H01L 31/0336* (2006.01)

(52) U.S. Cl. ........................................ 257/40; 257/184
(58) Field of Classification Search .................. 257/40, 257/88–103, 183–186, E31.003, E51.005
See application file for complete search history.

(56) References Cited

U.S. PATENT DOCUMENTS 6,278,055 B1 8/2001 Forrest et al. ............... 136/263

(Continued)

FOREIGN PATENT DOCUMENTS

WO WO 9949525 9/1999

(Continued)

OTHER PUBLICATIONS

M. Pfeiffer, et al., "Controlled p-Doping of Pigment Layers by Cosublimation: Basic Mechanisms and Implications for Their Use in Organic Photovoltaic Cells", Solar Energy Materials & Solar Cells, 63, pp. 83-99 (2000).

(Continued)

*Primary Examiner*—Cuong Q Nguyen
(74) *Attorney, Agent, or Firm*—Heslin Rothenberg Farley & Mesiti P.C.

(57) ABSTRACT

The invention relates to a photoactive component, especially a solar cell, comprising organic layers and formed by at least one stacked pi, ni, and/or pin diode. The diodes are characterized in that they comprise at least one p-doped or n-doped transport layer having a larger optical band gap than that of the photoactive layer. The individual diodes are characterized by a high internal quantum yield, but can be optically thin (peak absorption <80%). A high external quantum yield is obtained by either enlarging the optical path of the incident light in the diodes using light traps, or by stacking a plurality of the diodes. The transition between two diodes being facilitated by transition layers for the purposes of improved recombination and generation. Both forms of embodiment have a number of specific advantages using the doped transport layers with a large band gap.

33 Claims, 3 Drawing Sheets

U.S. PATENT DOCUMENTS

| | | | |
|---|---|---|---|
| 6,340,789 B1 | 1/2002 | Petritsch et al. | 136/263 |
| 6,559,375 B1 | 5/2003 | Meissner et al. | 136/263 |
| 2006/0250076 A1* | 11/2006 | Hofmann et al. | 313/504 |
| 2009/0078312 A1* | 3/2009 | Konemann et al. | 257/40 |

FOREIGN PATENT DOCUMENTS

| | | |
|---|---|---|
| WO | WO 0033396 | 6/2000 |

OTHER PUBLICATIONS

P.A. Lane, et al., "Electroabsorption Studies of Phthalocyanine/Perylene Solar Cells", Solar Energy Materials & Solar Cells, 63, pp. 3-13 (2000).

D. Meissner, et al., "Highly Efficient Molecular Organic Solar Cells", AQR, Physical Chemistry, Johannes-Kepler University, pp. 10-14 (2000).

J. Drechsel, et al., "High Efficiency Organic Solar Cells Based on Single or Multiple PIN Structures", Science Direct, Thin Solid Films, 451-452, pp. 515-517 (2004).

D. Gebeyehu, et al., "Bulk-Heterojunction Photovoltaic Devices Based on Donor-Acceptor Organic Small Molecule Blends", Solar Energy Materials & Solar Cells, 79, pp. 81-92 (2003).

J. Huang, et al., "Low-Voltage Organic Electroluminescent Devices Using Pin Structures", Applied Physics Letters, vol. 80, No. 1, pp. 139-141 (Jan. 7, 2002).

L. Stolz Roman, et al., "Trapping Light in Polymer Photodiodes with Soft Embossed Gratings", Advanced Materials, vol. 12, No. 3, pp. 189-195 (2000).

Yakimov, et al., "High Photovoltage Multiple-Heterojunction Organic Solar Cells Incorporating Interfacial Metallic Nanoclusters", Applied Physics Letters, vol. 80, No. 9, pp. 1667-1669 (Mar. 4, 2002).

"Organische Solarzellen—Abschlussbericht zum BMFT Forschungsvorhaben", Wolfgang Bohm et al. 1995, pp. 7-1 to 7-13.

\* cited by examiner

PHOTOACTIVE COMPONENT WITH ORGANIC LAYERS

CROSS REFERENCE TO RELATED APPLICATIONS

This application is a 371 filing of PCT International application no. PCT/DE2004/000574 filed Mar. 19, 2004 and published in German as WO 2004/083958 A2 on Sep. 30, 2004 which claims priority of German application no. 103 13 232.5 filed Mar. 19, 2003, the disclosures of which are hereby incorporated by reference herein in their entirety.

BACKGROUND ART

The invention concerns a photoactive component with organic layers, in particular a solar cell, consisting of a series of organic thin layers and contact layers with a doped transport layer and a photoactive layer, arranged in a pi, ni, or pin diode structure from a p, i or n layer respectively.

Since the demonstration of the first organic solar cell with an efficiency in the percentage range by Tang et al. 1986 [C. W. Tang et al. Appl. Phys. Lett. 48, 183 (1986)], organic materials have been intensively examined for various electronic and optoelectronic components. Organic solar cells consist of a series of thin layers (typically 1 nm to µm) comprising organic materials which are preferably vapor deposited in a vacuum or spin coated. The electrical contacting generally occurs via metal layers and/or transparent conductive oxides (TCOs).

A solar cell converts light energy into electrical energy. In contrast to inorganic solar cells, free charge carriers are not directly created by the light in organic solar cells, but rather excitons are initially formed, i.e. electrically neutral excitation states (bound electron-hole pairs). Only in a second stage are these excitons separated into free charge carriers which then contribute to the electrical current flow.

The advantage of such organic-based components in comparison to conventional inorganic-based components (semiconductors such as silicon, gallium arsenide) is the, in part, extremely high optical absorption coefficients (up to $2 \times 10^5$ cm$^{-1}$), thus providing the opportunity to create very thin solar cells using a low amount of materials and energy. Further technological aspects are the low costs, the possibility of creating flexible large-area components on plastic films and the almost unlimited variations available in organic chemistry.

An option for realizing an organic solar cell already proposed in the literature [Martin Pfeiffer, "Controlled doping of organic vacuum deposited dye layers: basics and applications", PhD thesis TU Dresden. 1999] consists of a pin diode with the following layer structure:

0. Carrier, substrate,
1. Base contact, mostly transparent,
2. n-layer(s) (or p)
3. i-layer(s)
4. p-layer(s) (or n),
5. Top layer.

Here n or p denotes an n doping or p doping which results in an increase in the density of free electrons or holes in the thermal equilibrium state. In this context, such layers primarily represent transport layers. One or more i-layer(s) can thus consist of both a material and so-called interpenetrating networks. The light incident through the transparent base contact generates excitons in the i-layer or in the p-layer. These excitons can only be separated by very high electrical fields or at suitable interfaces. In organic solar cells, sufficiently high fields are not available, with the result that all concepts for organic cells promising success are based on exciton separation at photoactive interfaces.

The excitons reach such an active interface through diffusion, where electrons and holes are separate from each other. These can be between the p (n) layer and the i-layer or between two i-layers. In the integrated electrical field of the solar cell, the electrons are now carried away to the n area and the holes to the p area.

As excitons are always the first to be produced by the light rather than free charge carriers, the low-recombination diffusion of excitons at the active interface plays a critical role in organic solar cells. To contribute to the photoelectric current, the diffusion length in an effective organic solar cell must therefore significantly exceed the typical penetration depth of the light so that the predominant part of the light can be used. Perfect organic crystals or thin layers completely fulfill this criterion structurally and in respect to the chemical purity. For large-area applications, however, the use of mono-crystalline organic materials is not possible and the production of multiple layers with sufficient structural perfection has so far proved to be very difficult.

Instead of enlarging the excitation diffusion length, it is also possible to decrease the average gap to the next interface. WO 00/33396 discloses the formation of a so-called interpenetrating network: A layer contains a colloidally dissolved substance which is dispersed in such a way that a network forms through which charge carriers can flow (percolation mechanism). Either only one of the components or both components assume the task of the light absorption in such a solar cell. The advantage of this mixed layer is that the excitons generated only have to travel a very short distance until they reach a domain boundary where they are separated. The removal of electrons or holes occurs separately in the dissolved substance or in the remaining layer. As the materials are in contact with each other everywhere in the mixed layer, it is crucial in this concept that the separated charges have a long life on the relevant material and that closed percolation paths are available for both charge carriers to the respective contact from each location. This approach has enabled efficiencies of 2.5% to be achieved [C. J. Brabec, N. S. Sariciftci, J. C. Hummelen, Advanced Functional Materials 11, 15 (2001)].

Further familiar approaches for realizing or improving the properties of organic solar cells are listed in the following:

1.) One contact metal has a large work function and the other one has a small work function, with the result that a Schottky barrier is formed with the organic layer [U.S. Pat. No. 4,127,738].
2.) The active layer consists of an organic semiconductor in a gel or binding agent [U.S. Pat. No. 0,384,4843, U.S. Pat. No. 0,390,0945, U.S. Pat. No. 0,417,5981 and U.S. Pat. No. 0,417,5982].
3.) The creation of a transport layer which contains small particles which assume the charge carrier transport [U.S. Pat. No. 5,965,063].
4.) A layer contains two or more types of organic pigments which possess different spectral characteristics [JP 04024970].
5.) A layer contains a pigment which produces the charge carriers, and additionally a material which carries away the charge carriers [JP 07142751].
6.) Polymer-based solar cells which contain carbon particles as electron acceptors [U.S. Pat. No. 5,986,206].
17.) Doping of the above mixed systems for improvement of the transport properties in multiple layer solar cells [Patent application—file number: DE 102 09 789.5-33].

8.) Arrangement of individual solar cells on top of each other (tandem cell) [U.S. Pat. No, 4,461,922, U.S. Pat. No. 1,619,8091 and U.S. Pat. No. 1,698,092].

U.S. Pat. No. 5,093,698 discloses the doping of organic materials: Admixing an acceptor-like or donor-like doping substance increases the equilibrium charge carrier concentration in the layer and enhances the conductivity. According to U.S. Pat. No. 5,093,698 the doped layers are used as injection layers at the interface to the contact materials in electroluminescent components. Similar doping methods are analogously suitable for solar cells.

Despite the advantages described with interpenetrating networks, a critical issue lies in the fact that closed transport paths for both electrons and holes to their respective contacts have to be present in the mixed layer. Furthermore, as the individual materials only fill a part of the mixed layer, the transport properties for the charge carriers deteriorate significantly in comparison to the pure layers.

Owing to the small exciton diffusion lengths or transport and recombination problems in interpenetrating layers, the active layer thicknesses of organic solar cells are usually lower than the penetration depths of the light. Moreover, organic dyes only exhibit individual absorption bands, with the result that a material can never cover the complete optical spectrum. It is therefore desirable to use so-called light traps (light trapping) or to be able to stack several cells over each other. Such stacked cells were first realized by Yakimov et al. [A. Yakimov, S. R. Forrest, Appl. Phys. Lett. 80 (9). 1667 (2002)]. They consist of two layers per individual cell and requisite recombination centers at the interface between the individual cells. If, like Yakimov, we apply these recombination centers directly onto the photoactive material, they will not only ensure the required recombination of charge carriers from the n-th cell with opposite charge carriers from the n+1-th cell, but also form undesired recombination centers for excitons or charge carrier pairs from one and the same cell. Either recombination losses or inactive areas result from this. To prevent these effects, the layers must be made thicker than the corresponding width of the relevant photoactive zone so that absorption occurs in areas where they cannot be used. Such a problem occurs analogously in individual diode structures. In this way, however, the recombination losses occur immediately at the transition zones between the active layer and contact electrode.

BRIEF SUMMARY OF THE INVENTION

The invention is therefore based on the task of extensively reducing recombination losses or the occurrence of inactive areas in solar cells with organic layers.

In accordance with the invention, the problem formulation is solved by the features of Claim 1, namely, a photoactive component with organic layers is provided comprising a solar cell having a series of organic thin layers and contact layers with a doped transport layer and a photoactive layer, which are arranged in a first pi, ni or pin diode structure comprising a first p, i or n layer each, wherein the transport layer exhibits a greater optical band gap than the photoactive layer and the structure is partially transparent in at least one part of the solar spectrum from 350 nm to 2000 nm. Particularly favorable embodiments of the invention are described in Sub-claims 2 to 33.

The present invention is aimed towards the realization of solar cells which can consist of both an individual pi, ni or pin diode structure (corresponding to Claim 1, cf. FIG. 1) as well as several stacked pi, ni or pin diode structures (corresponding to Claim 7, cf. FIG. 2).

A pi, ni or pin diode structure is hereinafter simply referred to as the structure, insofar as one of the three structures is not referred to specifically in individual cases.

In this context, p denotes at least one p-doped layer (p-layer), i denotes (in electrical terms) at least one undoped layer or a layer only doped slightly in comparison (i-layer), of which at least one photon is absorbed and contributes to the generation of the current, and n represents at least one n-doped layer (n-layer).

The solution to the task definition outlined and the problem of the prior art described above is made possible corresponding to the invention in such manner that the recombination zone or the contact electrodes is separated from the active areas via layers with increased band gaps (wide-gap layers), in which neither excitons nor minority charge carriers which can recombine exist. Furthermore, they also serve to protect the i-layer as an active layer against destructive influences, during and after the separation of contact layers or recombination zones. Wide-gap transport layers (shown in FIG. 1 as $2a$, $4a$ and in FIG. 2 as $2b$, $4b$, $6b$, $8b$, etc.) involve materials whose absorptiveness differs significantly from that of the active layers. It is particularly advantageous if they only absorb in the UV range or UV-near range of the visible spectrum. It is therefore ensured that the essential absorption occurs in the active layers. It is also achieved that excitons are reflected at the transition zones to the wide-gap p-layers and not removed from the photoactive process. The transport properties in the wide-gap p-layers or n-layers for majority charge carriers are crucially improved through corresponding p-doping or n-doping in comparison to undoped layers, with the result that the layer thicknesses can be varied over a broad range in order to concentrate and hence optimize the maximum amount of optical field. The requirements in respect to the maximization of the integrated voltage in the individual diode structures, and at their interfaces after low-loss recombination, are also achieved through n-doping and p-doping of the wide-gap layers.

An enlargement of the path of the incident light and hence a conversion to a high internal and external yield is attained through the advantageous embodiment corresponding to Claim 3.

The option for stacking as many structures over each other as required (Claim 7) enables the individual structures to be kept so thin that they only exhibit low recombination losses and hence a high internal and external quantum yield. The cell structure therefore combines a low series resistance, a maximum photoelectric voltage and an optimum conversion of the photoelectric current in one photoelectric current.

A layer or a combination of layers, as indicated in Claims 11 to 16, favors a low-loss recombination in the reverse direction or generation in the forward direction at the transition zones between the individual structures. Furthermore, the morphology of the transition zones between the n-th and the n+1-th and the pi, ni or pin structure is also favored.

A layer corresponding to Claim 12 to 16 can serve as a diffusion block for dopants or other materials following in the technological series or for the purpose of an induced growth of the subsequent layers.

Generation of the photoelectric current in the i-layer of the photoactive element corresponding to the invention is based on one or a combination of the following active principles:
  a) Absorption of photons with resultant exciton formation and separation of the excitons into free charge carriers by an electric field.
  b) Absorption of photons in a first material with resultant exciton formation, diffusion of the excitons at an interface to a further material and separation of the excitons into free charge carriers at the interface.

c) Absorption of the photons by one or more components of a multiple component material which consists of at least the components K1 and K2, separation of the excitons resulting on K1 and K2 into electrons on k1 and holes on K2 and removal of the charge carriers in an interpenetrating network of the two components.

d) Generation corresponding to c) in a layer or a layer system which comprises at least one p-doped or n-doped multiple component layer.

BRIEF DESCRIPTION OF THE VARIOUS VIEWS OF THE DRAWINGS

The invention shall now be explained in more detail taking two embodiments as examples. In the associated drawings FIG. 1 shows an organic cell corresponding to the invention according to the principle of an individual diode structure (first embodiment example)

DETAILED DESCRIPTION

Figure 1:
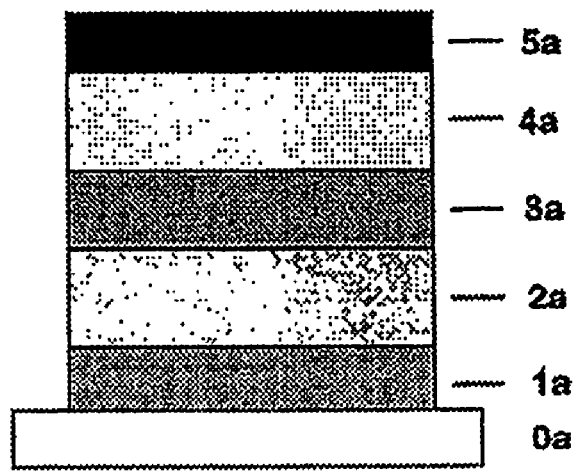

An advantageous embodiment shown in FIG. 1 comprising a structure for an organic solar cell corresponding to the invention according to the principle of an individual diode structure contains the following layers:

0a.) Carrier, substrate,

1a.) Base contact, mostly transparent, with optional organic or inorganic contact-making layer 2a.) Charge carrier transport layer (wide-gap), p-doped or n-doped 3a.) Active layer 4a.) Charge carrier transport layer (wide-gap), n-doped or p-doped 5a.) Top contact, optionally including organic or inorganic contact-making layer.

In accordance with this, the component advantageously consists of a pin or nip layer structure. The pin (or nip) structure for its part consist of two or more organic charge carrier transport layers respectively (2a and 4a) and a layer system (3a) located between the organic layer (2a) and the organic layer (4a), in which the light is absorbed. Furthermore, the complete structure also contains 2 contact layers (1a and 5a), each of which can also be realized as a transparent contact layer. Layers 2a or 4a are p-doped or n-doped, layer 3a is undoped or has very low p-doping or n-doping. Layer 3a is either single-component (apart from the doping) or involves mixed layers comprising two components corresponding to the principle of interpenetrating networks. The materials are selected in such a way that excitons are separated efficiently into free charge carriers at the internal phase limits in the mixed layer between the two materials or at the interface of two layers. In this and the other embodiments, the structure is partially transparent in at least one part of the solar spectrum from 350 nm to 2000 nm.

Figure 2:
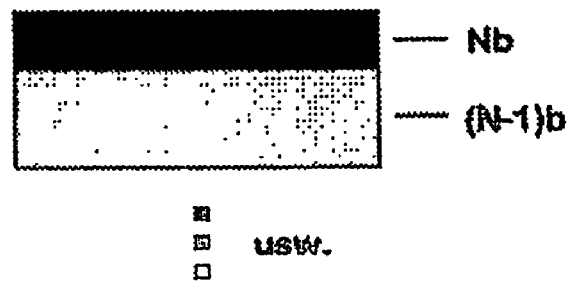
FIG. 2 shows an organic cell corresponding to the invention according to the principle of stacking (second embodiment example)
Figure 2:
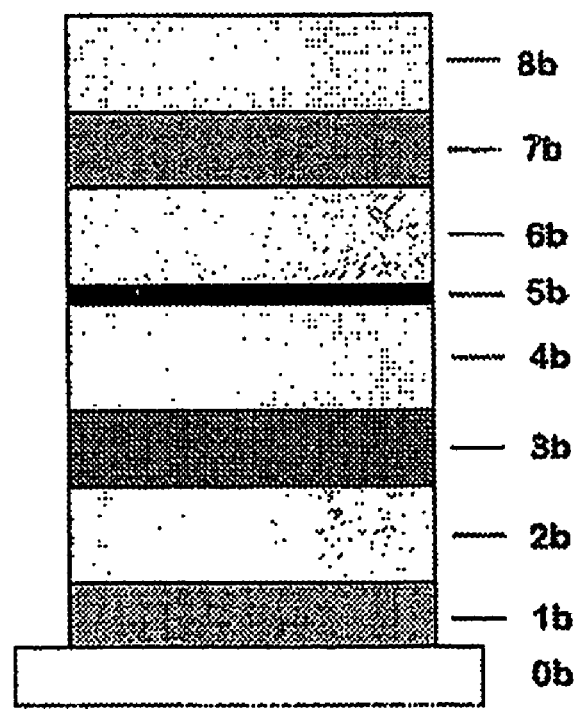

As shown in FIG. 2, an advantageous embodiment of a structure for an organic solar cell corresponding to the invention based on the stacking principle contains the following layers:

0a.) Carrier, substrate,

1b.) Base contact, mostly transparent, with optional organic or inorganic contact-making layer 2b.) Charge carrier transport layer (wide-gap), p-doped or n-doped 3b.) First active layer 4b.) Charge carrier transport layer (wide-gap), n-doped or p-doped 5b.) Transition layer, recombination zone 6b.) Transition layer (wide-gap), n-doped or p-doped 7b.) Second active layer, 8b.) Charge carrier transport layer (wide-gap), p-doped or n-doped etc.

(N-1)b.) Charge carrier transport layer (wide-gap), p-doped or n-doped

Nb.) Top contact, optionally including organic or inorganic contact-making layer In accordance with this, the component advantageously consists of at least two pin or nip layer structures. The pin (or nip) structures for their part consist of two or more organic charge carrier transport layers respectively (2b and 4b, 6b and 8b etc.) and a layer system (3b. 7b etc.) located between the organic layer (2b, 6b etc.) and the organic layer (4b, 8b etc.), in which the light is absorbed. Furthermore, the complete structure also contains 2 contact layers (1b and Nb) as well as a transition layer system between the n-th and the n+1-th pin (nip) cell respectively, each of which can also be realized as a transparent contact layer. Layers 2b, 6b etc. or 4b 8b etc. are p-doped or n-doped, layer 3b, 7b etc. is undoped or has very low p-doping or n-doping. Layer 3b. 7b etc. is either single-component (apart from the doping) or involves mixed layers comprising two components corresponding to the principle of interpenetrating networks. The materials are selected in such a way that excitons are separated efficiently into free charge carriers at the internal phase limits in the mixed layer between the two materials or at the interface of two layers.

The charge carrier transport layers 2b, 4b, 6b etc. do not have to be photoactive and can be doped. Corresponding to the invention, at least one of the transport layers is doped in each diode structure. Each charge carrier transport layer ensures an efficient removal of a charge carrier type (holes or electrons). Moreover, the active layers become separated from the contacts or the recombination layers 5b, 9b etc. and hence prevent the exciton or charge carrier pairs from a diode from encountering undesired recombination centers.

Figure 3A:
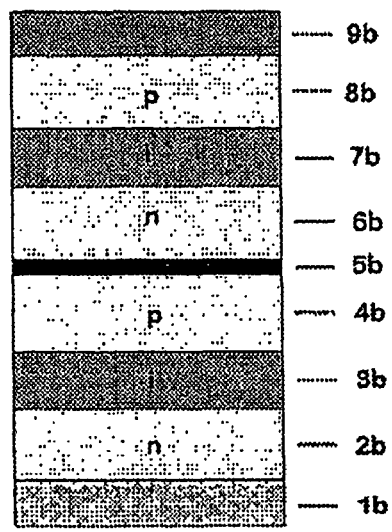
FIG. 3a shows a photoactive component according to the principle of stacking, which consists of 2 pin cells.

For representation purposes, the functioning is explained using the example of a photoactive component which consists of 2 pin cells. Simple and multiple pin cells function analogously. Such a stacking cell is shown in FIG. 3a and its energy scheme is outlined in FIG. 3b. For a better overview, it may be assumed that the transport layers, active layers and transition layers only consist of an individual layer. At the same time, the active layers of the first pin cells (3b) should cover an absorption layer different to that of pin cell two (7b) in order to utilize as broad a spectrum as possible. In addition to this, it may be assumed that the active layers in the sense of the interpenetrating networks consist of a mixture of two materials each. A exciton should now be generated in the undoped material of the first mixed layer (3b). The exciton diffuses in this material until it has reached a domain boundary within the mixed layer. Here it is separated, whereby the hole remains on the donor-like material and the electron remains on the acceptor-like material. Both charge carriers then migrate to the corresponding doped transport layers. This thus ensures an effective transition and the respective charge carrier layer enables an efficient transport of the electron to the contact (1b) or of the hole to the transition layer (5b). The process occurs analogously in the second pin cell (6b), (7b), (8b). The charge carriers are now present at both contacts (1b), (9b). However, in order to ensure a current flow, the two charge carriers, which were provided in the direction of the transition layer (5b), must recombine with each other so that the electric circuit is closed. Only as low as possible an energy loss should occur in this recombination. This is attained, as explained in more detail below, by doping at least one of the adjoining transport layers and, if necessary, incorporating the transition layer (5b). When using highly doped transport layers, such a transition layer might not be necessary.

The balance of the current generated in the individual cells is particularly important in such stacking cells, i.e. the number of photons absorbed and converted into charge carriers. In accordance with the invention, this is ensured by adapting the layer thicknesses and/or selection of the materials with a correspondingly different absorption capacity.

Figure 3B:
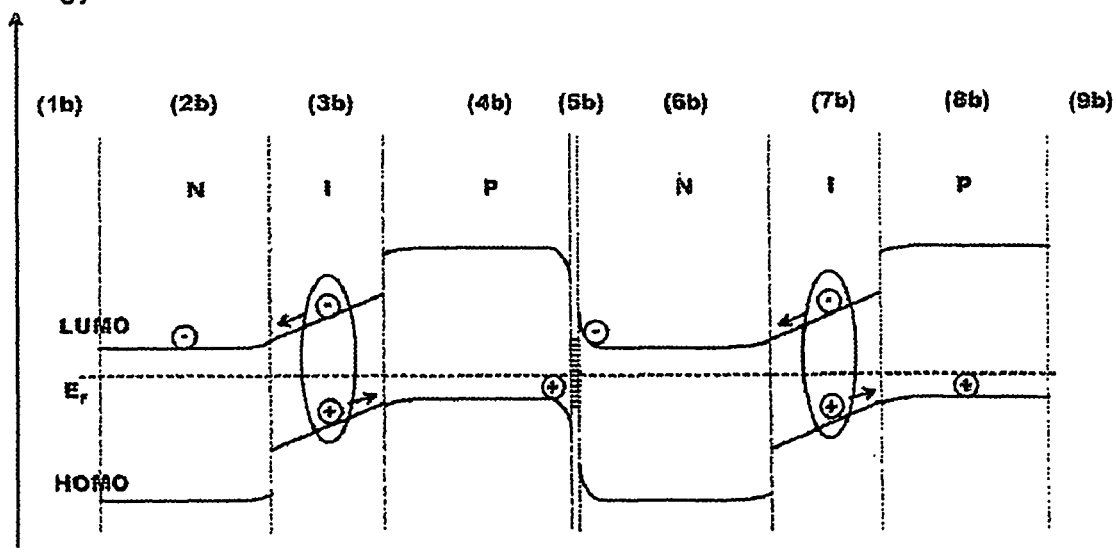
FIG. 3b shows an energy scheme for the photoactive component shown in FIG. 3a, FIG. 4 shows a layer sequence of the dual structure

The functioning of the component is explained in more detail below on the basis of the energy scheme. FIG. 3b shows a schematic representation of the HOMO (highest occupied molecular orbital) and LUMO (lowest unoccupied molecular orbital) levels taking a dual pin stacking structure as an example. For the sake of simplicity here too, only one layer each is shown for charge carrier generation (active layer 3b and 7b), hole transport (4b and 8b), and electron transport (2b and 6b). An exciton should now be generated in each active layer by the light. This can now dissociate locally into a hole and an electron (cf. interpenetrating networks) or also diffuse so far until it reaches a separating boundary layer within the active layer, whereupon it dissociates.

In accordance with the invention, a diffusion process of the excitons ensures that non-separated excitons are reflected by the adjoining wide-gap transport layers and remain available for dissociation and hence for charge carrier generation. The resultant charge carriers are transported to the boundaries of the active layers by the integrated field, which results through equalization of the different Fermi levels of the n-doped or p-doped layers (2b, 6b etc. 4b, 8b), and can be accepted by the transport layers.

The materials are preferably to be selected in such way that the charge transition between the active layer and the transport layers is only energetic for one charge carrier type (electrons for the n-layer, holes for the p-layer). In an advantageous embodiment, the energy levels coincide with each other iso-energetically, as shown in FIG. 3b.

Charge carriers in the layers 2b and 8b can pass directly onto the contact 1b or 9b. At the same time, the doping of the transport layers has a positive effect, as the transition to contacts is made easier (also with work functions which are not ideally adapted) via a strong band distortion and hence via a reduction of the depletion zone (quasi-ohmic contact). Charge carriers in the layers 4b (holes) and 6b (electrons) pass over to the transition layer (5b), where they can recombine. Their transition is especially favored by the advantageous influence of the doping previously described (quasi-ohmic contact).

Concentration of the optical field for the purpose of increased absorption in the active areas through an optimum selection of optical constants and layer thicknesses for the transport layers is also an objective of the invention.

In the sense of the invention, the charge carriers are preferably doped (in the sense of an electrically effective doping). In the case of molecular organic systems, the molar doping concentrations are typically in the region of 1:10 to 1:10000. If the dopants are significantly smaller than the matrix molecules, more dopants than matrix molecules can also be present in the layer (up to 5:1). The dopants can be organic or inorganic.

Essential features of the invention result from doping of the transport layers. On the one hand, the transport layers are decisively improved through doping, with the result that losses (potential drop in the resistance) are minimized. Moreover, the doping has an advantageous effect on the recombination or generation characteristics at the transition between two pin cells. In this case, high doping also denotes a narrow depletion zone on both sides of this transition, with the result that high barriers can easily be overcome also (e.g. through the quantum mechanic tunnel process). Use of wide-gap materials means that this pn-transition is not photoactive either, thus preventing the build-up of a counter-voltage on illumination, which would reduce the usable photoelectric voltage.

A further advantageous embodiment of the above stacking cell involves incorporating a transition layer (possibly several layers) at the transition between two pin cells. This can be designed to be thin and serve the additional integration of recombination centers. It is particularly useful if this consists of metal clusters or an ultra-thin metal layer.

Figure 4:
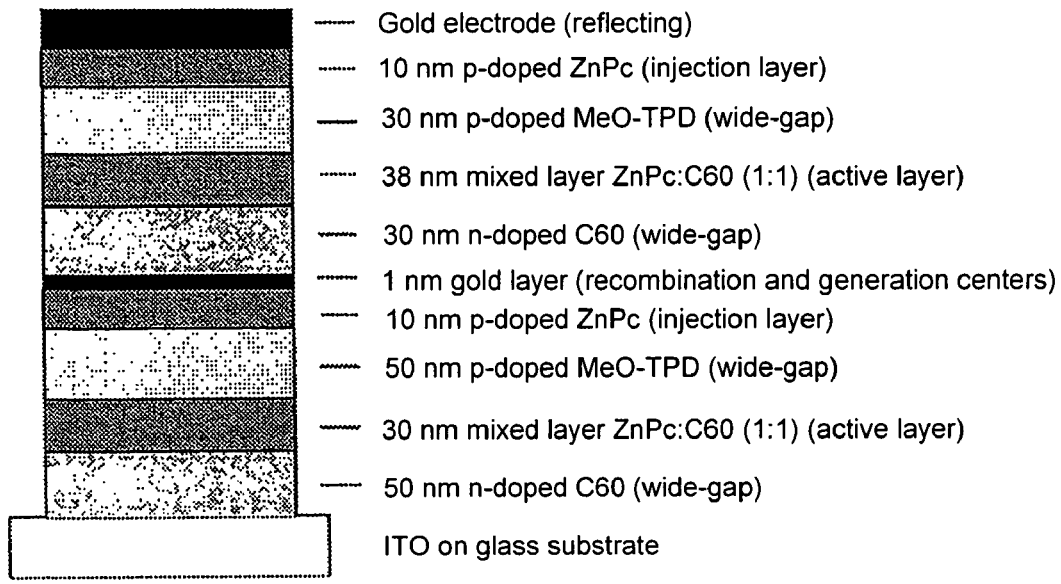
Figure 5:
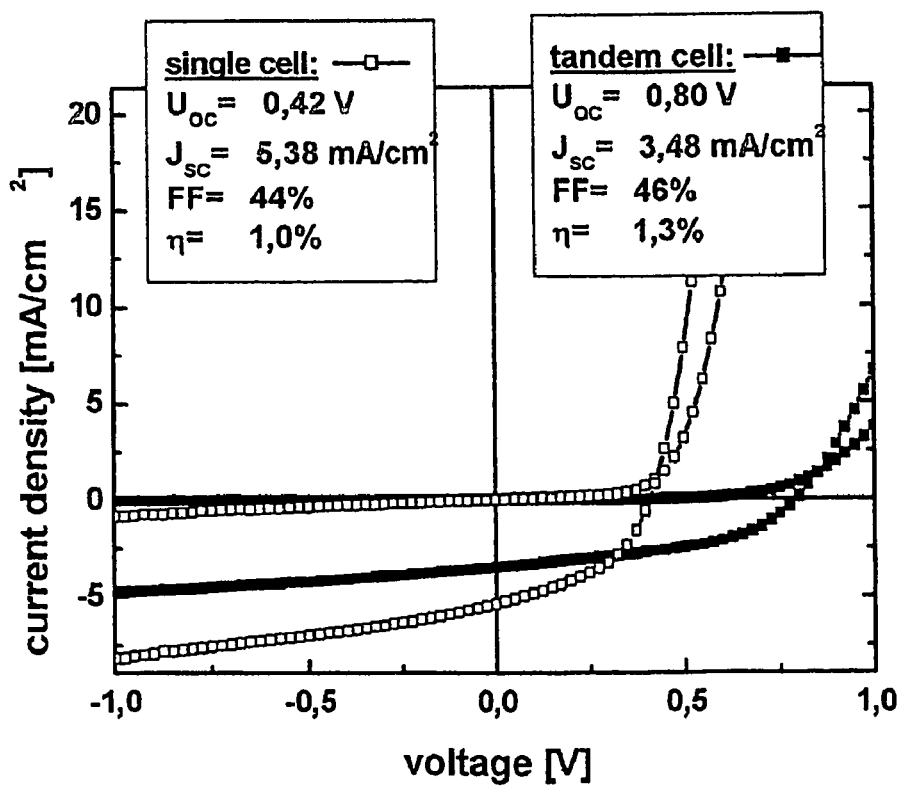
FIG. 5 shows a bright and dark characteristic curve.

Both a bright and a dark characteristic curve are shown in FIG. 5 to demonstrate the function of the above pin simple structure and a pin dual structure. FIG. 4 indicates the layer sequence of the dual structure. The simple structure corresponds to the first partial cells (starting from the substrate), whereby an approximately 40 nm gold layer is applied to the contacting instead the 1 nm thick gold layer. The cells shown are not yet optimized in any way. The approximate doubling of the open circuit voltage $U_{oc}$) confirms the functioning.

| Photoactive component with organic layers List of the references and abbreviations used | | | |
|---|---|---|---|
| HOMO | Highest Occupied Molecular Orbit | | |
| LUMO | Lowest Unoccupied Molecular Orbit | | |
| $E_f$ | Fermi level | | |
| 0a, 0b | Substrate | | |
| 1a, 1b | Contact layer | (wide-gap) | (p-doped or n-doped) |
| 2a, 2b | Transport layer | (wide-gap) | (p-doped or n-doped) |
| 3a, 3b | Active layer | | |
| 4a, 4b | Transport layer | (wide-gap) | (p-doped or n-doped) |
| 5a | Contact layer | (wide-gap) | (p-doped or n-doped) |
| 5b | Transition layer | | |
| 6b | Transport layer | (wide-gap) | (p-doped or n-doped) |
| 7b | Active layer | | |
| 8b | Transport layer | (wide-gap) | (p-doped or n-doped) |
| ... | | | |
| (N − 1)b | Transport layer | (wide-gap) | (p-doped or n-doped |
| Nb | Contact layer | | |

The invention claimed is:

1. Photoactive component with organic layers, comprising a solar cell having a series of organic thin layers and contact layers with a doped transport layer and a photoactive layer, which are arranged in a first pi, ni or pin diode structure comprising a first p, i or n layer each, wherein the transport layer exhibits a greater optical band gap than the photoactive layer and the structure is partially transparent in at least one part of the solar spectrum from 350 nm to 2000 nm.

2. Photoactive component according to claim 1, wherein the photoactive layer is separated before, during and after separation of the contact layers through the transport layer.

3. Photoactive component according to claim 1, wherein an optical path of incident light is extended in the photoactive layer by means of a light trap.

4. Photoactive component according to claim 3, wherein the light trap is formed in such way that the doped transport layer exhibits a smooth boundary layer to the i-layer and a periodically micro-structured interface to a contact area.

5. Photoactive component according to claim 3, wherein the component is located on a periodically micro-structured substrate and the doped transport layer is positioned to ensure a homogenous function of the component on the entire area.

6. Photoactive component according to claim 1, wherein the i-layer comprises several layers with different absorption spectra.

7. Photoactive component according to claim 1, wherein a second pi, ni or pin diode structure is provided, wherein a transport layer of the second structure exhibits a greater optical band gap than a photoactive layer of the second structure and the second structure is partially transparent in at least one part of the solar spectrum from 350 nm to 2000 nm.

8. Photoactive component according to claim 7, wherein the i-layers of the first and second structures exhibit a same optical absorption respectively and are each optically thin, so that they transmit at least 50% of light at an absorption maximum, or the i-layers of the first and second structures exhibit different optical absorption spectra which complement each other.

9. Photoactive component according to claim 7, wherein at least three structures are present which comprise both several optically thin i-layers with a same absorption spectra as well as i-layers with different, complementary absorption spectra.

10. Photoactive component according to one of claim 7, wherein the i-layer of at least one of the structures compromises several layers with different absorption spectra.

11. Photoactive component according to claim 7, wherein the n-layer or p-layer which is near to a transition between two structures exhibits a doping.

12. Photoactive component according to claim 7, wherein a layer of a metal, a salt or an inorganic material is incorporated between a p-layer of an n-th structure and an n-layer of an n+1-th structure.

13. Photoactive component according to claim 12, wherein several layers of a metal, a salt or an inorganic material are incorporated between the p-layer of the n-th structure and the n-layer of the n+1-th structure.

14. Photoactive component according to claim 12, wherein one or more doped layers comprising an organic or inorganic semiconductor material are incorporated.

15. Photoactive component according to claim 12, wherein a transparent or semitransparent layer is added comprising a metal, a salt or another inorganic material, preferably a TCO (transparent conductive oxide), or several of these layers.

16. Photoactive component according to claim 12, wherein a layer is incorporated comprising nano-clusters of a metal, a salt or another inorganic or organic material or several such layers.

17. Photoactive component according to claim 7, wherein a transparent or semitransparent contact for individual contacting of the first and second structures is added between a p-layer of an n-th structure and an n-layer of an n+1-th structure.

18. Photoactive component according to claim 7, wherein one or more light traps are used.

19. Photoactive component according to claim 7, wherein the contact layers comprise highly transparent ITO (indium tin oxide), other transparent and conductive materials, such as ZnO, conductive polymers or metal as a semitransparent layer.

20. Photoactive component according to claim 7, wherein a thickness of the i-layers, is selected in such way that all structures provide the same photoelectric current under consideration of distribution of an optical field in the photoactive component.

21. Photoactive component according to claim 1, wherein the p-layer comprises a p-doped layer, an i-layer comprises an undoped layer in electrical terms or a layer only slightly doped in comparison to doped layers, of which at least one is formed as a layer absorbing photons and generating current and hence as a photoactive layer, and an n-layer comprising at least one n-doped layer.

22. Photoactive component according to claim 1, wherein an entire structure of the component is provided with a transparent and a reflecting contact.

23. Photoactive component according to claim 1, wherein the contact layers comprise metal, a conductive oxide, in particular ITO, ZnO:Al or other TCOs, or a conductive polymer, in particular PEDOT:PSS.

24. Photoactive component according to claim 21, wherein a thickness of the n-doped or p-doped layers is selected in such way that a position of the i-layer is optimized in relation to a field strength distribution of an optical field.

25. Photoactive component according to claim 1, wherein a doping thickness in one or more of the photoactive or transport layers exhibits a gradient, whereby the doping thickness in the transport layer decreases in the direction of the photoactive layer.

26. Photoactive component according to claim 1, wherein components in the photoactive or mixed layers, comprise organic materials.

27. Photoactive component according to claim 1, wherein at least one dopant comprises an alkali metal.

28. Photoactive component according to claim 1, wherein at least one part of the photoactive layers is comprised wholly or partially of inorganic materials.

29. Photoactive component according to claim 1, wherein at least one part of the transport layer is comprised wholly or partially of inorganic materials.

30. Photoactive component according to claim 1, wherein organic acceptor molecules from the class of quinones, tetracyanoquinodimethane, (TCNQ derivatives such as F4-TCNQ), dicyanoquinodiimine (DCNQI derivatives) and corresponding derivatives of higher quinones (naphthoquinone and anthraquinone derivatives) are used for p-doping of the transport layers.

31. Photoactive component according to claim 1, wherein a material from one of the following material classes is used as a host material for a p transport layer:
  a) Derivatives of tetraphenyldiamine (TPD), whose ionization energy is lowered through electron-separating substituents such as methoxy or methyl groups, as well as spiro derivatives thereof,
  b) Trimethylamine derivatives, in particular derivatives of tris(diphenylamino)-triphenylamine (TDATA), triaminophenly derivatives, triphenlybenzene derivatives,
  c) Oligomers which receive a donor character through the use of thiophene rings, in particular oligothiophenes,
  d) Derivatives of oligo-para-phenylene vinylenes (OPPV),
  e) Porphyrines or phthalocyanines,
  f) Perylene or terrylene derivatives.

32. Photoactive component according to claim 1, wherein a material from one of the following material classes is used as a host material for an n transport layer:

a) Derivatives of perylene or naphthalene tetracarboxylic acid diimide (PTCDI, NTCDI), perylene or naphthalene tetracarboxylic acid dianhydride (PTCDI, NTCDA) perylene or naphthalene tetracarboxylic bisimidazole (PTCDI, NTCBI),
b) Fullerenes such as C60 or C70 and derivatives thereof,
c) Phthalocyanines or porphyrines, whose electron affinity has been increased through electron-attracting substituents such as fluorine or chlorine,
d) Quinones,
e) Oligomers with increased electron affinity through substituents such as fluorine, chlorine, CF3, CN etc., e.g. fluorinated oligophenyls,
f) Oxadiazol derivatives.

33. Photoactive component according to claim 1, wherein the photoactive layer contains primarily donor-like substances from the material classes cited in claim 31 and primarily acceptor-like substances from the material classes cited in claim 32.

\* \* \* \* \*